United States Patent [19]

Starr et al.

[11] 3,972,740

[45] Aug. 3, 1976

[54] THERMOCOUPLE WITH IMPROVED EMF STABILITY

[75] Inventors: Carrol Dean Starr, Whippany; Teh Po Wang, North Caldwell, both of N.J.

[73] Assignee: Wilbur B. Driver Company, Newark, N.J.

[22] Filed: July 31, 1975

[21] Appl. No.: 600,266

[52] U.S. Cl. ............................. 136/239; 75/170
[51] Int. Cl.² ........................................ H01L 23/18
[58] Field of Search ...................... 75/170; 136/239

[56] References Cited
UNITED STATES PATENTS 3,457,122  7/1969  Sibley et al. .................. 136/239 X
3,673,003  6/1972  Starr ............................. 136/239 X
3,776,781  12/1973 Starr et al. ...................... 136/239
3,820,983  6/1974  Starr et al. ...................... 75/170

Primary Examiner—Leland A. Sebastian
Attorney, Agent, or Firm—Norman J. O'Malley; John C. Fox; Donald R. Castle

[57] ABSTRACT

A nickel-base thermocouple with improved EMF stability is described, the positive thermoelement of which is a nominal Ni/14.25Cr/1.45Si/.1Mg alloy and the negative thermoelement of which is a nominal Ni/4Si/.1Mg alloy.

3 Claims, 6 Drawing Figures

THERMOCOUPLE WITH IMPROVED EMF STABILITY

BACKGROUND OF THE INVENTION

This invention relates to a nickel-base thermocouple having improved EMF stability in the temperature range of 800°F to 1000°F.

Nickel-base alloys have been in use as thermocouple alloys for temperature measurement and control for some time. An accepted couple is the type K thermocouple so designated by ISA (Instrument Society of America). The positive thermoelement of the type K thermocouple is an alloy typically having the composition in weight percent of 9 Cr, 0.4Si, balance Ni (Ni/9Cr/.4Si). Typical trade names are Chromel (manufactured by Hoskins) and Tophel (manufactured by W. B. Driver Co.). The negative thermoelement of the type K thermocouple is a Ni base alloy typically containing 93 weight percent Ni with Al, Mn, Si, Fe, and Co additions. Typical trade names are Alumel (manufactured by Hoskins) and Nial (manufactured by W. B. Driver Co.).

Among the existing type K thermocouple alloys, the negative thermoelement is less stable (larger EMF deviations) and less oxidation resistant than the positive thermoelement when exposed to an elevated temperature such as 1800°F. A negative thermoelement with improved oxidation resistance and EMF stability and a thermocouple incorporating this thermoelement are described in U.S. Pat. Nos. 3,820,983, and 3,776,781, issued to C. D. Starr and T. P. Wang on June 28, 1974 and Dec. 4, 1973, respectively.

The EMF of the positive type K thermoelement, a Ni/9Cr/.4Si alloy, has recently been found to change significantly when heated for a relatively short time (for example, one hour) in the temperature range of 800°F to 1000°F. This EMF change is not caused by the preferential oxidation of the alloy, but is believed to be associated with the short range ordering reaction of the nickel-chromium alloy which has been reported in the literature. Nordheim, R. & Grant, N. S., "Resistivity Anomalies in the Nickel-Chromium System," J. of the Institute of Metals, Vol. 82, p. 440 (1953–54); Taylor, A. and Hinton, K. G., "A Study of Order-Disorder and Precipitation Phenomena in Nickel-Chromium Alloy," ibid, Vol. 81, p. 451 (1952–53); Starr, C. D. and Wang, T. P., "The Electrical Characteristics of a Nickel-Chromium-Aluminum-Copper Resistance Wire," Proc. of Institution of Electrical Engineers, Vol. 104, p. 515, (1957). Herein, short range ordering means periodic arrangement of atoms in localized areas only of the crystalline lattice of the alloy. Normally, the thermocouple is heated rapidly to an elevated temperture such as 1800°F and cooled rapidly to ambient temperature. Upon maintaining the thermocouple in the temperature range of 800°F to 1000°F, however, the chromium and the nickel atoms may arrange themselves in a periodic manner through diffusion in the crystalline lattice, leading to the undesirable changes in EMF and resistivity of the alloy.

Thus, the advantages of improved EMF stability of the negative thermoelement of U.S. Pat. No. 3,820,983 cannot be fully realized in thermocouples incorporating it, particularly in the temperature range of 800°F to 1000°F.

An improved positive thermoelement is described in Ser. No. 553,666, assigned to the present assignee. However, this composition does not exhibit EMF stability upon exposure to the 800°F to 1000°F range.

SUMMARY OF THE INVENTION

In accordance with the invention, a new thermocouple has been developed in which the negative thermoelement of U.S. Pat. No. 3,820,983 is used in conjunction with an alloy having the nominal composition in weight percent 14.25 Cr, 1.45Si, 0.1Mg, balance essentially Ni (herein Ni/14.25 Cr/1.45Si/0.1Mg), as the positive thermoelement. The new couple exhibits much improved EMF stability over the existing type K couple after extended exposure to the intermediate temperature range of 800°F to 1000°F when subsequently heated to 1800°F.

DETAILED DESCRIPTION OF THE INVENTION

For a better understanding of the present invention, together with other and further objects, advantages and capabilities thereof, reference is made to the following disclosure and appended claims in connection with the above-described drawings.

In accordance with the invention, increasing Cr content from about 9 percent in the existing type K thermoelement to within the range of 13.75 to 14.75 weight percent and preferably 14.00 to 14.50 weight percent improves EMF stability after exposure to the range of 800°F to 1000°F. In addition, by maintaining the Si content within the range of 1.25 to 1.75 weight percent and preferably 1.35 to 1.65 weight percent, and by the addition of 0.05 to 0.15 weight percent magnesium, and preferably 0.08 to 0.12 weight percent, the oxidation resistance and EMF stability of the resulting alloy is much improved over that of the existing type K thermoelement alloy. Above the upper ranges for silicon or magnesium, the workability of the alloy for wire forming is impaired.

In addition to the essential constituents set forth above, the alloy may additionally contain minor additives of other alloying elements or deoxidizers in conventional amounts such as zirconium, calcium, and aluminum, the total of such additives however not to exceed a total level of about 0.5 weight percent. In addition, the alloys may contain those impurities commonly found in conventional starting materials, such impurities for example including cobalt, iron, carbon, and manganese, the total of all such impurities however not to exceed a level of approximately 3 weight percent.

To demonstrate the improved EMF stability of the couple of the invention, type K positive and negative thermoelements were exposed to 900°F for 1 hour, and change in EMF in microvolts measured at 500°F, 1000°F, 1500°F and 1800°F. Results were compared with the couple of the invention employing a negative element of Ni/4Si/0.1Mg and a positive thermoelement of Ni/14.25Cr/1.45Si/0.1Mg. Results are shown in Table I.

TABLE I

EMF CHANGE IN MICROVOLTS OF INDIVIDUAL THERMOELEMENTS AND THE THERMOCOUPLE OF THIS INVENTION VS. PRIOR ART AFTER ONE HOUR EXPOSURE TO 900°F

| Prior Art | ΔEMF in Microvolts | | | |
|---|---|---|---|---|
|  | 500°F | 1000°F | 1500°F | 1800°F |
| K+(Ni/9Cr/.4Si) | +4 | +159 | +164 | +168 |
| K−(93Ni with Al, Mn, Fe, Co) | +13 | −21 | −24 | −26 |
| Couple | −9 | +180 | +188 | +194 |
| This Invention |  |  |  |  |
| Ni/14.25Cr/1.45Si/.1Mg | −15 | −7 | −11 | −9 |
| Ni/4Si/.1Mg | +4 | +6 | +3 | +2 |
| Couple | −19 | −13 | −14 | −11 |

(Cold Junction 32°F)

Figure 1A:
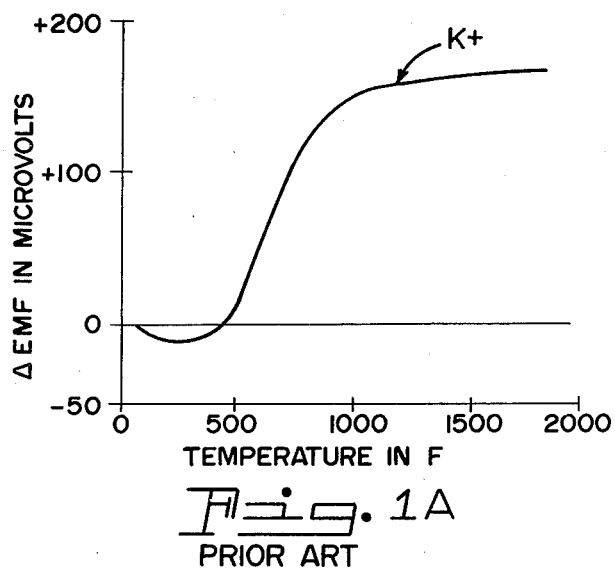
FIG. 1 (a), (b) and (c) are graphs of change in EMF in microvolts versus temperture in °F for the existing type K negative thermoelement, the existing type K positive thermoelement and the type K thermocouple, respectively.
Figure 2A:
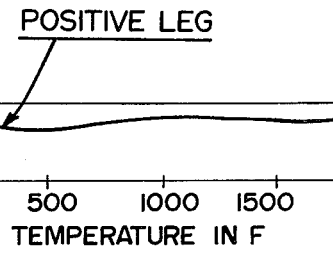
FIG. 2 (a), (b) and (c) are graphs similar in all respects to those of FIG. 1, for the negative thermoelement, positive thermoelement and thermocouple of this invention.
Figure 1B:
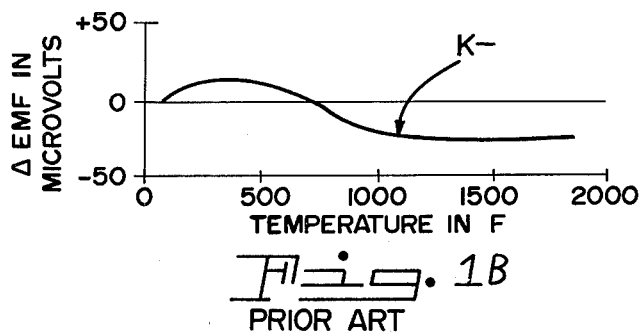
Figure 2B:
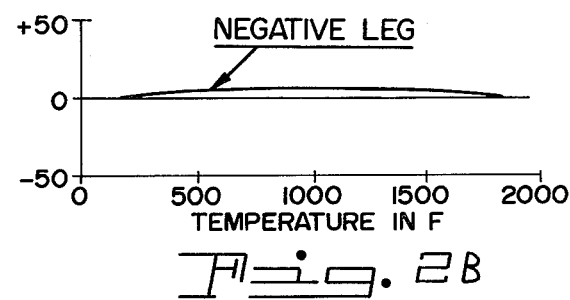
Figure 1C:
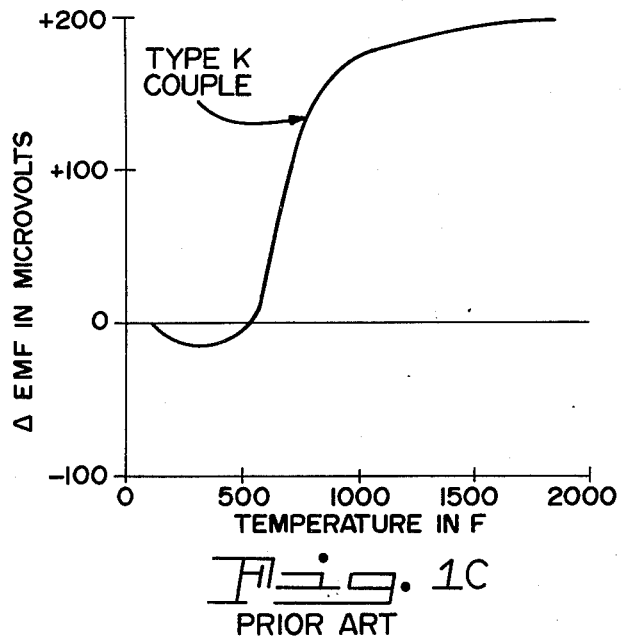
Figure 2C:
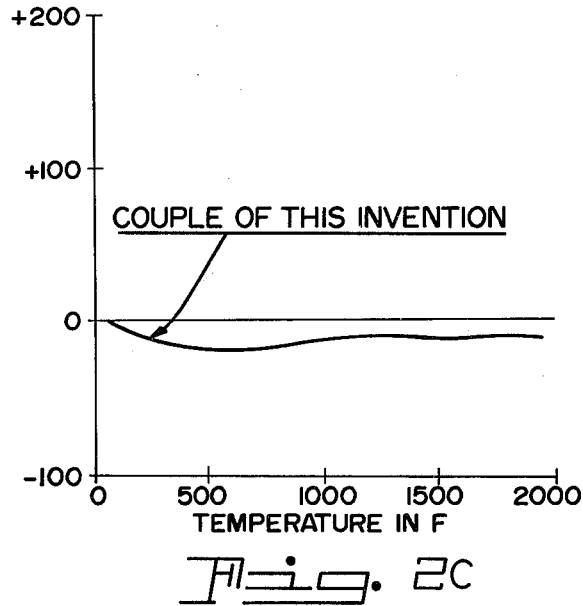

Table I lists the EMF change of the individual thermoelements after 1 hour aging at 900°F. The total EMF change of the couple is the algebraic difference of the individual change of the positive and the negative thermoelement of the couple. The EMF data in Table I are plotted in FIG. 1(a), (b) and (c) and FIG. 2(a), (b) and (c).

It can be readily observed that the EMF change of the new positive thermoelement is much smaller than that of the existing type K positive thermoelement after one hour aging at 900°F and the total EMF change of the thermocouple of this invention is about one tenth that of the prior art.

While there has been shown and described what are at present considered the preferred embodiments of the invention, it will be obvious to those skilled in the art that various changes and modifications may be made therein without departing from the scope of the invention as defined by the appended claims.

What is claimed is:

1. A thermocouple consisting essentially of a positive thermoelement wire and a negative thermoelement wire metallurgically joined together, the positive thermoelement wire consisting essentially of an alloy of from about 13.75 to 14.75 weight percent Cr, about 1.25 to 1.75 weight percent Si, about .05 to 0.15 weight percent Mg, balance Ni, and the negative thermoelement wire consisting essentially of an alloy of from about 3.75 to 4.25 weight percent Si, about 0.10 to 0.20 weight percent Mg, balance Ni.

2. The thermocouple of claim 1 wherein the positive thermoelement wire consists essentially of an alloy of from about 14.00 to 14.50 weight percent Cr, about 1.35 to 1.65 weight percent Si, 0.08 to 0.12 weight percent Mg, balance Ni.

3. The thermocouple of claim 2 wherein the negative thermoelement wire consists essentially of an alloy of about 4 weight percent Si, about 0.15 weight percent Mg, balance Ni.

* * * * *

Disclaimer and Dedication

3,972,740.—*Carrol Dean Starr*, Whippany and *Teh Po Wang*, North Caldwell, N.J. THERMOCOUPLE WITH IMPROVED EMF STABILITY. Patent dated Aug. 3, 1976. Disclaimer and Dedication filed Sept. 18, 1980, by the assignee, *Amax Inc.*

Hereby disclaims and dedicates to the Public the entire term of said patent.

[*Official Gazette December 9, 1980.*]